(12) United States Patent
Cho

(10) Patent No.: US 11,625,590 B2
(45) Date of Patent: Apr. 11, 2023

(54) MEMRISTIVE MULTI-TERMINAL SPIKING NEURON

(71) Applicant: The Government of the United States of America, as represented by the Secretary of the Navy, Arlington, VA (US)

(72) Inventor: Hans S. Cho, Vienna, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 408 days.

(21) Appl. No.: 16/827,745

(22) Filed: Mar. 24, 2020

(65) Prior Publication Data
US 2020/0320374 A1    Oct. 8, 2020

Related U.S. Application Data

(60) Provisional application No. 62/829,823, filed on Apr. 5, 2019.

(51) Int. Cl.
*G06N 3/063*    (2023.01)
*G06N 3/049*    (2023.01)

(52) U.S. Cl.
CPC ............ *G06N 3/063* (2013.01); *G06N 3/049* (2013.01); *H10B 63/80* (2023.02); *H10N 70/24* (2023.02);
(Continued)

(58) Field of Classification Search
CPC ........ G06N 3/063; G06N 3/049; G06N 3/065; H01B 63/80; H10N 70/24; H10N 70/826; H10N 70/841; H10N 70/8833
See application file for complete search history.

(56) References Cited

U.S. PATENT DOCUMENTS

| | | | |
|---|---|---|---|
| 9,311,594 B1* | 4/2016 | Fisher | G06N 3/049 |
| 2018/0018358 A1 | 1/2018 | Birdwell et al. | |
| 2019/0244088 A1* | 8/2019 | Yang | G06N 3/061 |

OTHER PUBLICATIONS

Shahsavari, Mahyar, Pierre Falez, and Pierre Boulet. "Combining a volatile and nonvolatile memristor in artificial synapse to improve learning in spiking neural networks." 2016 IEEE/ACM international symposium on nanoscale architectures (NANOARCH). IEEE, 2016.
(Continued)

*Primary Examiner* — Thomas Fink
(74) *Attorney, Agent, or Firm* — US Naval Research Laboratory; Stephen T. Hunnius

(57) ABSTRACT

A memristive multi-terminal spiking neuron apparatus, comprising a non-volatile memristor, wherein the non-volatile memristor has a resistance ratio between the high-resistance and low-resistance states exceeding 4 decades of magnitude, wherein the non-volatile memristor retains its resistance states for a time period exceeding 1 second, a volatile memristor, wherein the volatile memristor retains its low-resistance state for a time period of less than 10 nanoseconds, and a capacitor, wherein the volatile memristor is in parallel with the capacitor. A method of making a programmable electrical spiking output from a memristive multi-terminal spiking neuron, comprising providing one or more devices wherein each device comprises a non-volatile memristor, a volatile memristor, wherein the volatile memristor is in parallel with the capacitor, providing a first input spiking signal to a neuron device, providing a second input spiking signal, and creating a programmable spiking output signal which changes.

4 Claims, 11 Drawing Sheets

(52) U.S. Cl.
CPC ......... *H10N 70/826* (2023.02); *H10N 70/841* (2023.02); *H10N 70/8833* (2023.02)

(56) References Cited

OTHER PUBLICATIONS

Lee, H. Y., et al. "Low-power and nanosecond switching in robust hafnium oxide resistive memory with a thin Ti cap." IEEE Electron Device Letters 31.1 (2009): 44-46.
Yang, Rui, et al. "Synaptic plasticity and memory functions achieved in a WO3—x-based nanoionics device by using the principle of atomic switch operation." Nanotechnology 24.38 (2013): 384003.
Li, Qingjiang, et al. "A memristor SPICE model accounting for synaptic activity dependence." PloS one 10.3 (2015): e0120506.

* cited by examiner

Metal oxide memristor film

CNT mat 2D material

MEMRISTIVE MULTI-TERMINAL SPIKING NEURON

REFERENCE TO RELATED APPLICATION

This application is a non-provisional of, and claims priority to and the benefits of, U.S. Provisional Patent Application No. 62/829,823 filed on Apr. 5, 2019, the entirety of which is herein incorporated by reference.

BACKGROUND

This disclosure concerns teachings to demonstrate the device structure and function of a solid-state artificial spiking neuron consisting of memristors with multiple terminals.

These devices are designed to implement a programmable electrical spiking output that changes in response to electrical input spiking signals received through a network from similar neighboring devices. The teachings describe the structure and operation principles of these devices, and of the networks consisting of these devices as well. These devices and networks form the basis of systems that can perform specialized cognitive computing tasks far more efficiently than conventional Si CMOS-based systems in terms of SWaP (size, weight and power) criteria.

Neuromorphic, or brain-inspired, computing has been proposed as an alternative to the dominant Von Neumann computing paradigm based on digital hardware. Complex and imprecise tasks such as image recognition and human speech acquisition may be processed more effectively and efficiently using neuromorphic computing devices. While reengineered digital hardware has been successfully employed in neuromorphic computing methods, such as deep learning neural networks, these have required large volumes of hardware and immense amounts of energy to perform tasks that humans perform routinely using brains consuming several orders of magnitude less space and energy.

This becomes a significant barrier to applications in systems such as airborne, submersible, or space-deployed remote and autonomous systems, where size and power limitations are mission-critical.

Systems with advanced cognitive computing capabilities are forecast to increasingly become central to many facets of technology, but this transformation will not be possible unless supported by the development of a new scalable and projectable architecture. However, commercial interests are less incentivized to address these issues, instead focusing on the established approach of cloud computing based on connectivity to centralized datacenters. The orthogonal requirements to limit SWaP while offering orders of magnitude additional computational capabilities motivate efforts to develop a new paradigm for computing devices and architectures, independent of industry driving forces.

In analogy to the biological neural system and its components, a neuromorphic computing system can be modeled as a network consisting of nodes, or neurons, that are connected to other neurons by synapses, which may number several thousand per neuron. In this model, the synapses dynamically modulate electrical impulses (spikes) travelling between neurons, which integrate and synthesize the received impulses into a state response, which in turn triggers the axon hillock to fire a spike through the axon channel which propagates to neighboring neurons, again via synapses.

Although a spiking mechanism utilizing CMOS ring oscillators, op-amps, or CMOS floating gates is simple to realize, and has the advantage of being naturally compatible with the digital infrastructure prevalent today, its power consumption and circuit area footprint limits its scalability going forward, and the integrate and fire (IF) mechanism it reproduces is simplistic and incapable of resolving or generating complex temporal spiking behavior.

Recently, nano-scale devices known as memristors have demonstrated electrical response properties strongly analogous to those of synapses that in a Si-based architecture would require circuitry consuming hundreds of $\mu m^2$ of die area to replicate.

Memristors may be categorized as volatile or non-volatile, depending on the retention time of a given resistive state after the memristor has been switched. Hybrid circuits combining memristor synapses with neuron equivalents fabricated in CMOS have been widely reported.

Efforts towards using memristors to emulate spiking behavior have led to simple spiking based on Mott-insulator-based neuristors and memcapacitive circuits. These approaches utilize the mechanism of spiking by capacitor discharge and recharge modulated by a dynamically coupled type of volatile memristance known as negative differential resistance (NDR).

However, these are not fully integrated on a single substrate and have relied on large discrete passive components for significant parts of their circuitry.

One aspect lacking from the neuromorphic components developed to date is a fully integrated, memristor-based, neuron equivalent with sufficient state storage and logic processing capability to process complex information contained in incoming spikes and convert it into a decision to generate a sequence of spikes that in turn encodes and transmits information.

This current invention solves these problems and provides for a memristive multi-terminal spiking neuron.

SUMMARY OF DISCLOSURE

Description

This disclosure teaches methods and the product of a memristive multi-terminal spiking neuron.

This disclosure concerns teachings to demonstrate the device structure and function of a solid-state artificial spiking neuron consisting of memristors with multiple terminals.

These devices are designed to implement a programmable electrical spiking output that changes in response to electrical input spiking signals received through a network from similar neighboring devices. The teachings describe the structure and operation principles of these devices, and of the networks consisting of these devices as well. These devices and networks form the basis of systems that can perform specialized cognitive computing tasks far more efficiently than conventional Si CMOS-based systems in terms of SWaP (size, weight and power) criteria.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

This disclosure teaches a memristive multi-terminal spiking neuron.

This disclosure concerns teachings to demonstrate the device structure and function of a solid-state artificial spiking neuron consisting of memristors with multiple terminals.

These devices are designed to implement a programmable electrical spiking output that changes in response to electrical input spiking signals received through a network from similar neighboring devices. The teachings describe the structure and operation principles of these devices, and of the networks consisting of these devices as well. These devices and networks form the basis of systems that can perform specialized cognitive computing tasks far more efficiently than conventional Si CMOS-based systems in terms of SWaP (size, weight and power) criteria.

Example 1

Figure 1:
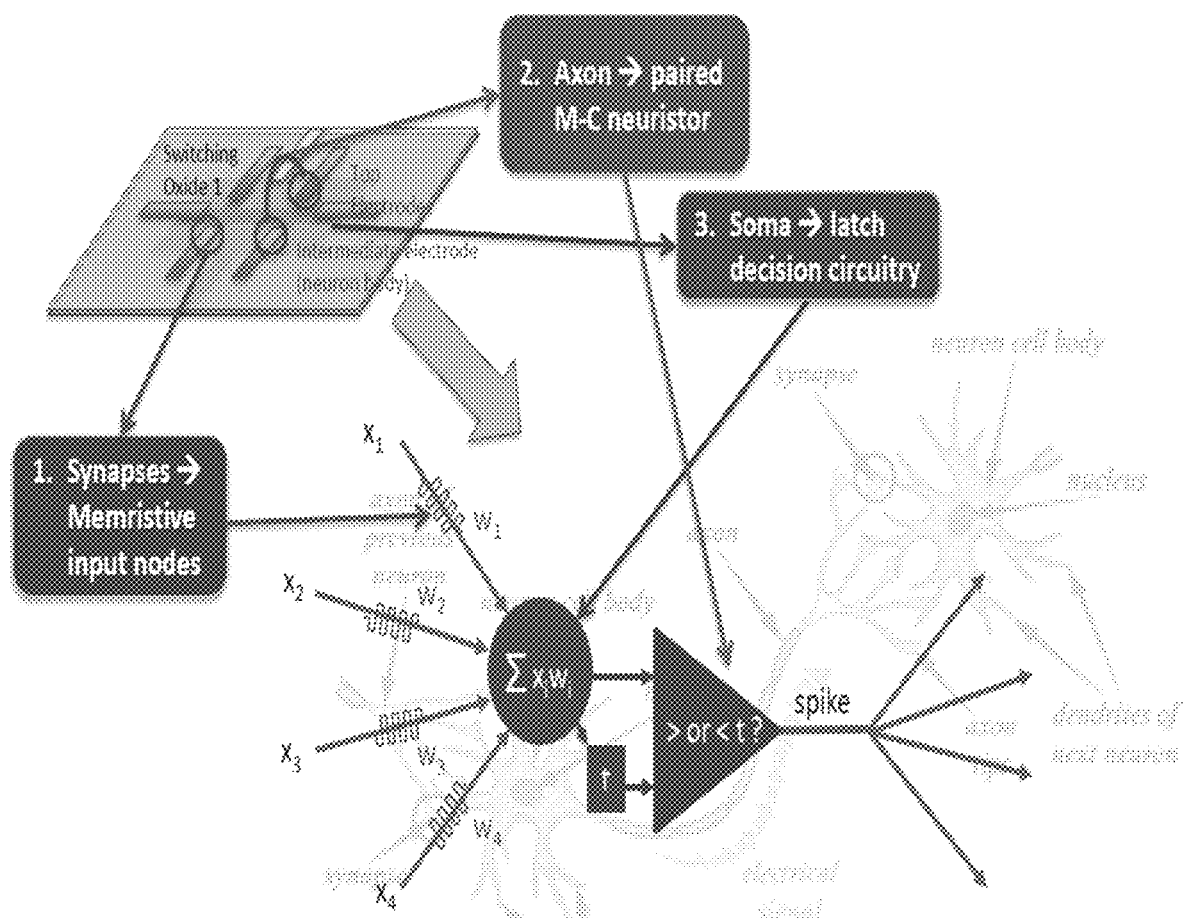
FIG. 1 illustrates a schematic diagram of the nanodevice (left top), its equivalent circuit (bottom center), and the biological neuron (background) they emulate. Labelled are the components of the device corresponding to the synapse, axon, and soma.

As illustrated in FIG. 1, the device described is a nanoelectronic neuron cell equivalent, based on multiple Mott memristors in parallel with integrated capacitors coupled together via a common electrode of finite mass and carrier population.

The common electrode also connects to one or more memristors, which have non-volatile resistive switching behaviors that retain their resistive state for significantly longer, under similar electrical perturbations, than do the Mott memristors.

These non-volatile memristors may act as memory elements or as logic switches to control the state function of the neuron cell as well as generate and modulate its spike firing behavior.

Figure 2:
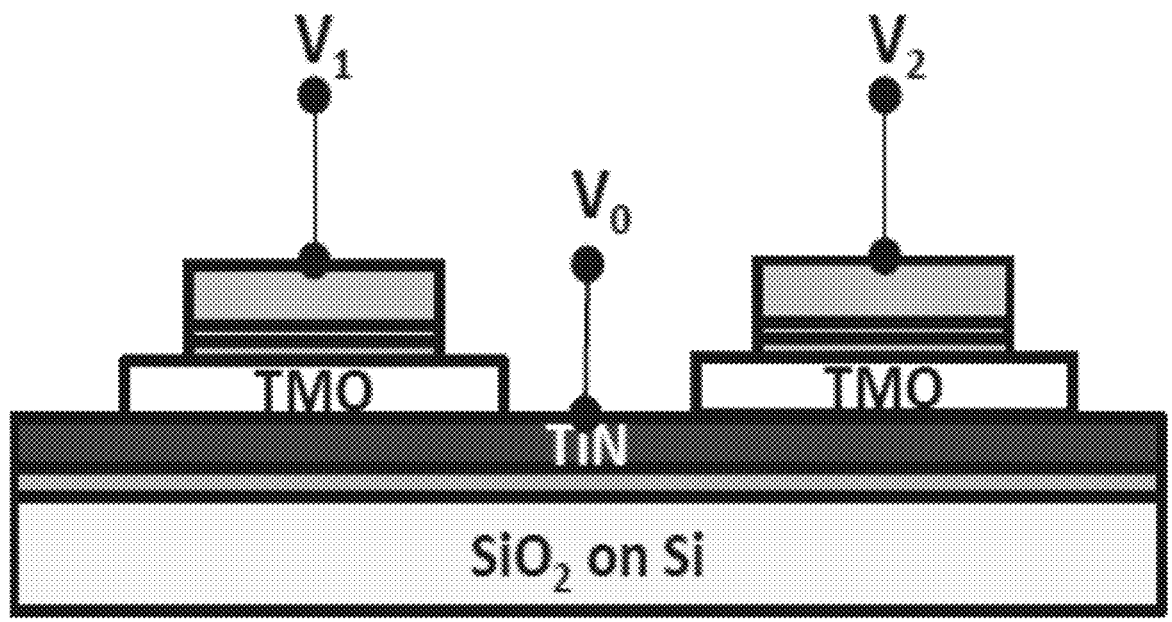
FIG. 2 illustrates a structure of back-to-back memristors fabricated onto a common electrode.
Figure 3:
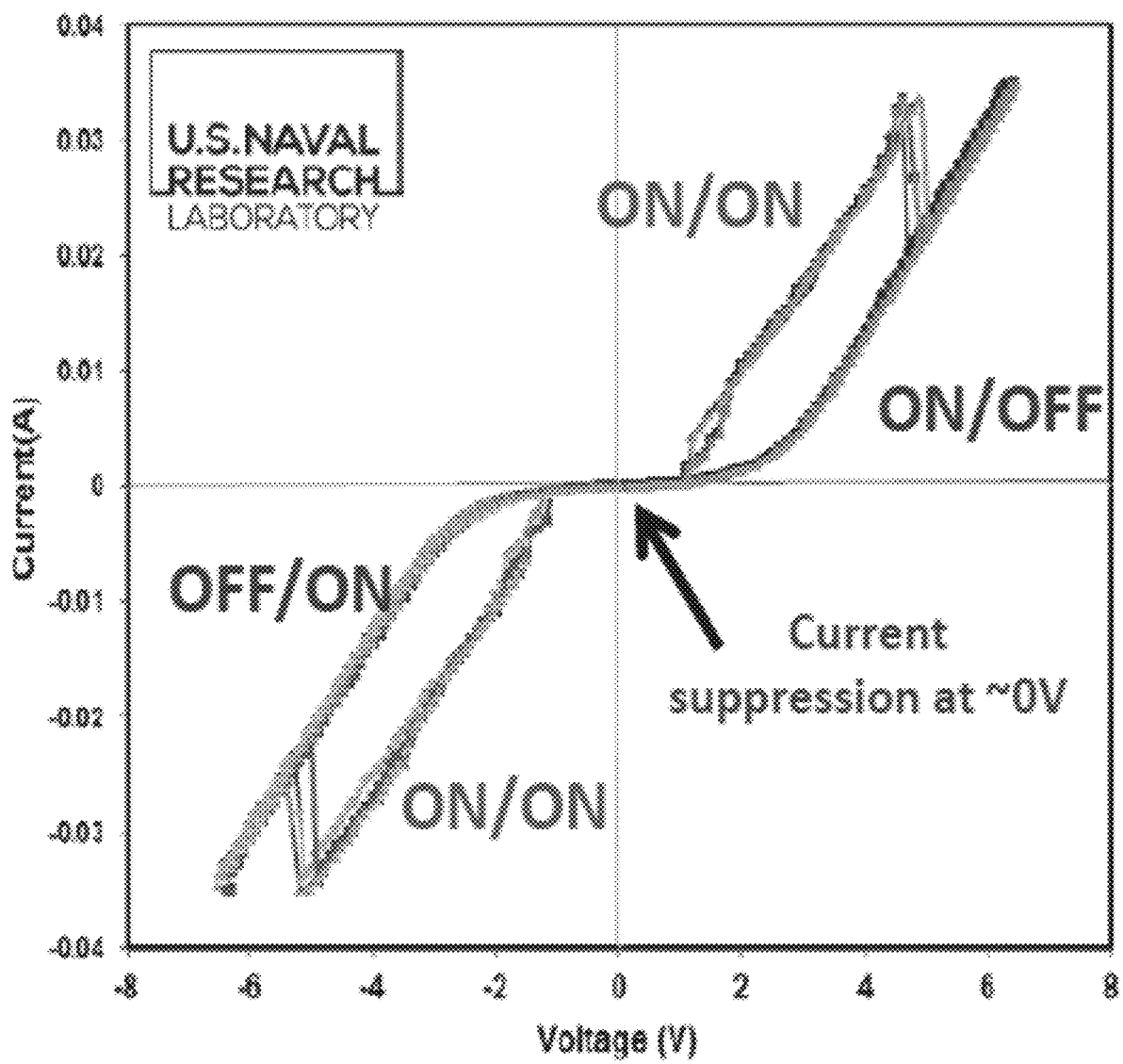
FIG. 3 illustrates a current-voltage plot of complementary resistive switching measured between electrodes $V_1$ and $V_2$.
Figure 4:
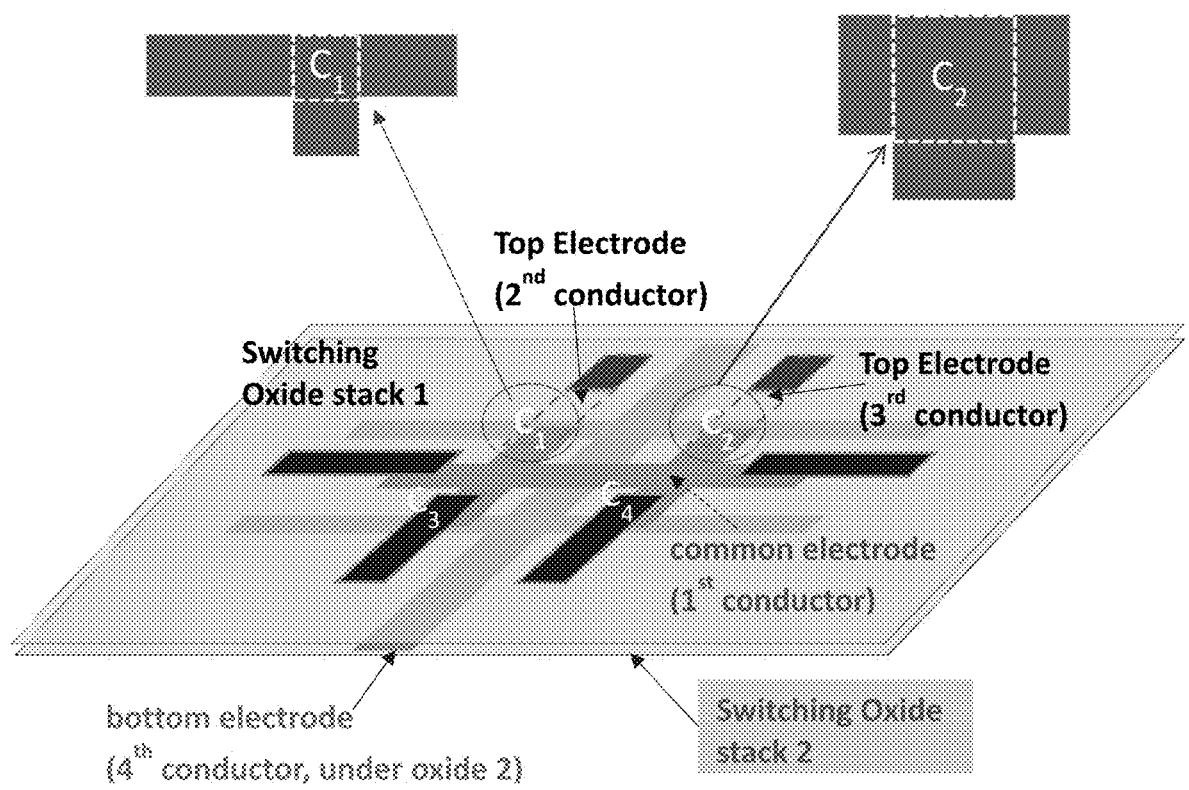
FIG. 4 illustrates a Latch device bridging multiple contact sites with different capacitance values.
Figure 5:
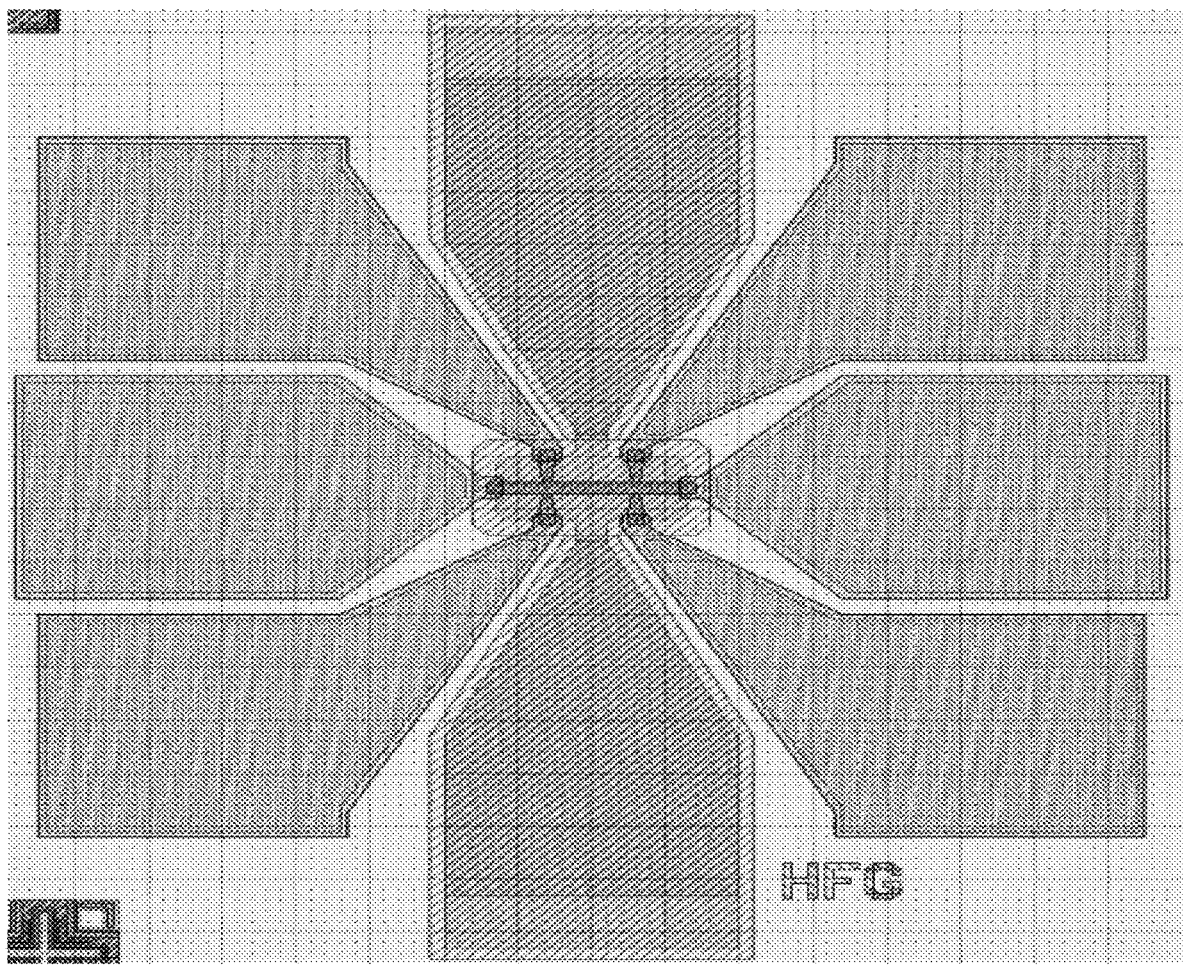
FIG. 5 illustrates a multi-terminal memristive (MRC) latch device.
Figure 6:
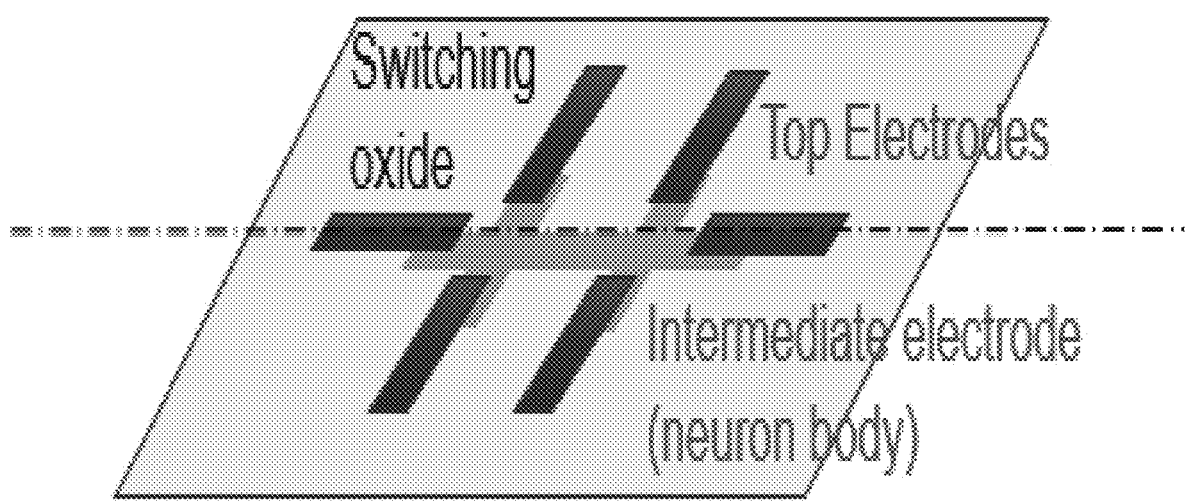
FIG. 6 illustrates a multi-terminal memristive (MRC) latch device.
Figure 7:
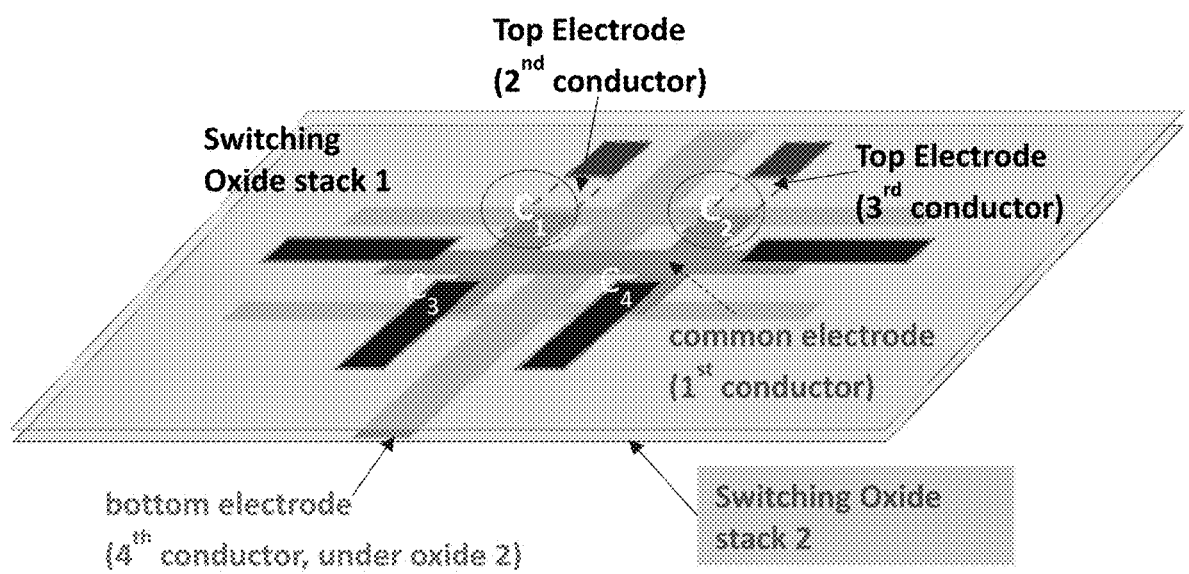
FIG. 7 illustrates a multi-terminal memristive (MRC) latch device.
Figure 8:
FIG. 8 illustrates a multi-terminal memristive (MRC) latch device.
Figure 8:
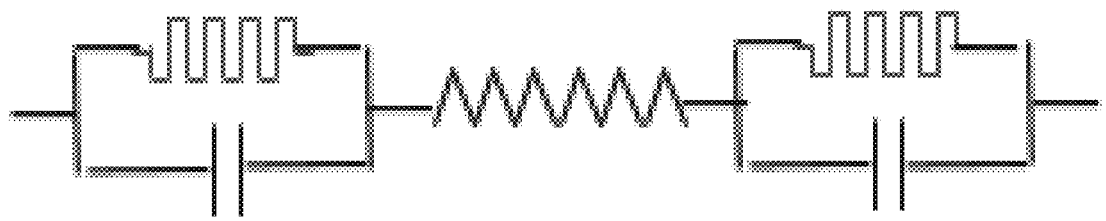
Figure 9:
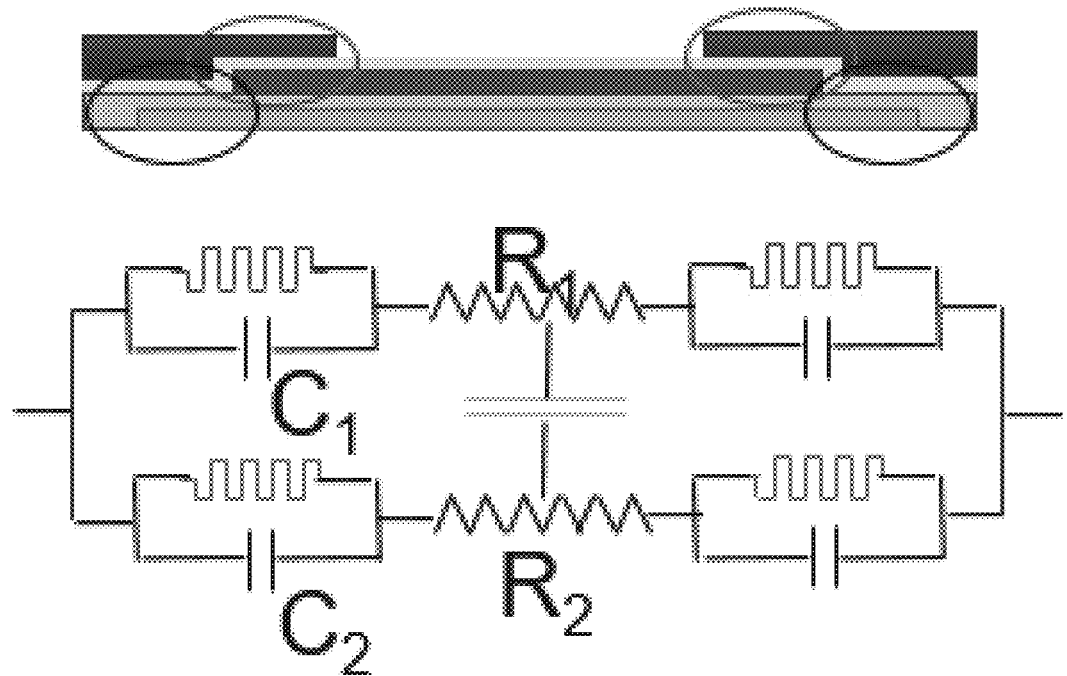
FIG. 9 illustrates a multi-terminal memristive (MRC) latch device.
Figure 10:
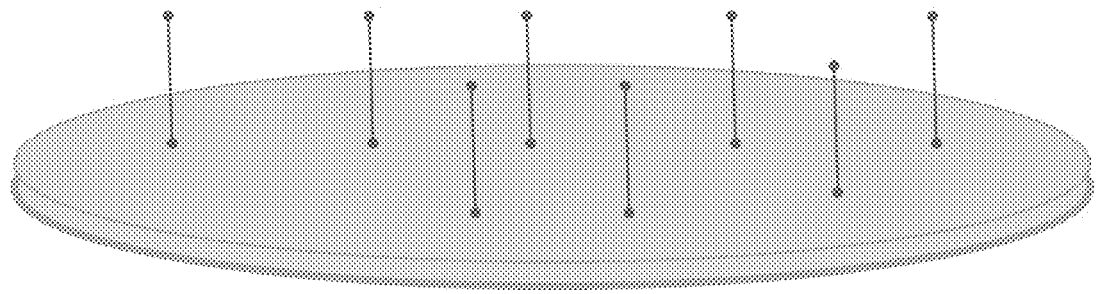
FIG. 10 illustrates a multi-terminal memristive (MRC) latch device.
Figure 10:
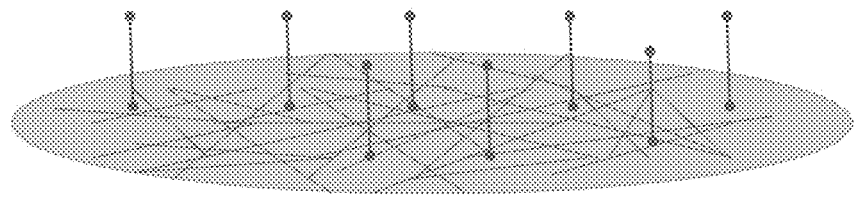
Figure 10:
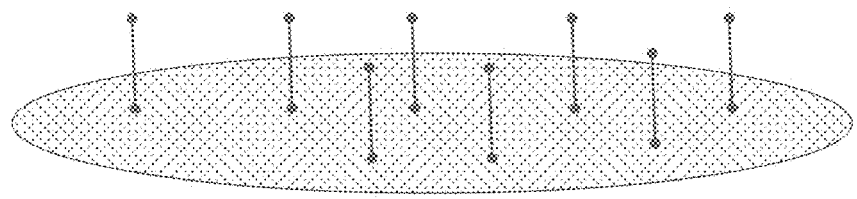
Figure 11:
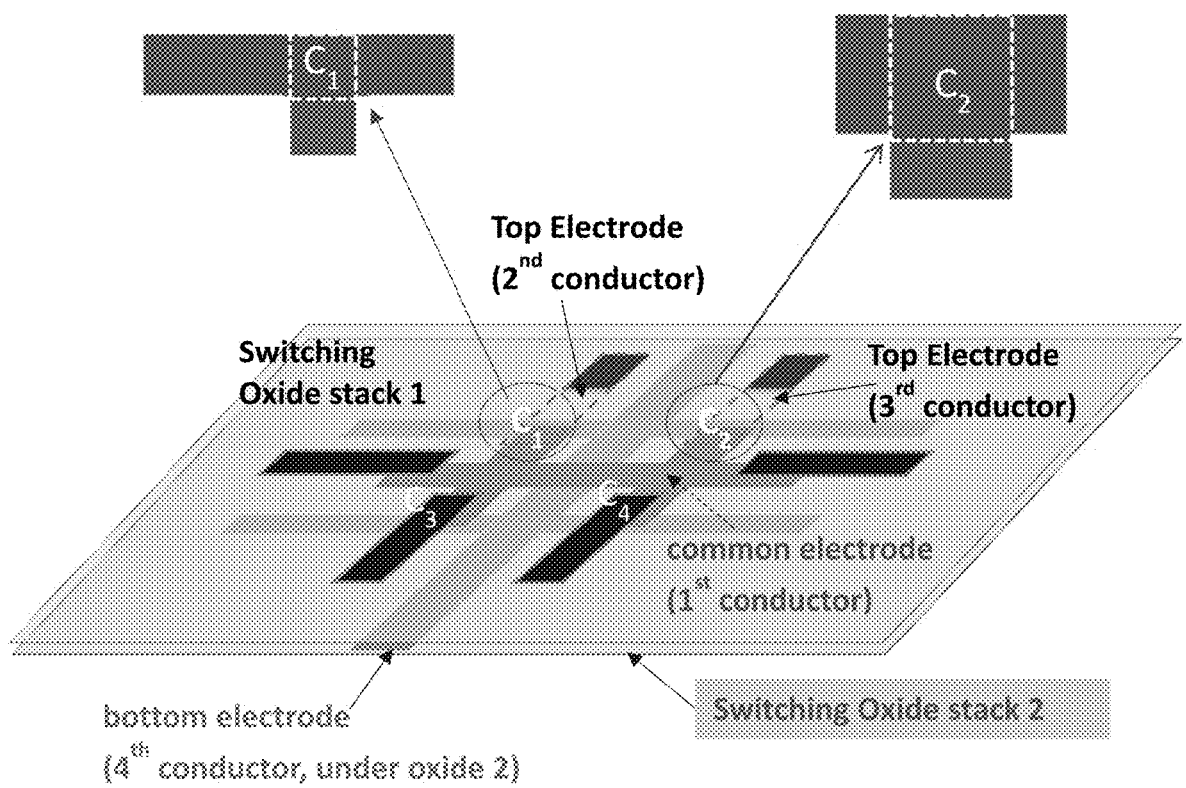
FIG. 11 illustrates a multi-terminal memristive (MRC) latch device bridging multiple contact sites with different capacitance (or other parameter) values.

The logic switches may include a coupled memristor latch consisting of two or more memristors fabricated onto a common bottom electrode, as in FIG. 2.

Example 2

The current-voltage characteristics (FIG. 2) between two such memristors in an anti-parallel configuration exhibit complimentary resistive switching. Such bistable crossbar latches have switching characteristics capable of generating a complete family of logic operations. The invention extends this concept to a multi-terminal configuration incorporating volatile (NDR) as well as non-volatile memristors, to enable devices capable not only of realizing externally readable logic functions, but also of integrating those functions as a means to controllably select the spiking mode from among several potential modes, thereby fulfilling the role of the neuron in the neuronal circuit.

A structure and operation of the artificial nanoelectronic neuron cell is described as follows.

Example 3

Pulsed signals (electrical, optical, or mechanical), or spikes, travel along conductive branches of the neurons, or dendrites, which are realized as any one of or combinations of metallic wires, optical fibers, waveguides, fluidic channels, or piezo-mechanical strings.

The neuron cell receives spikes emanating from other neuron cells at the contact points between those neuron cells and itself.

The contact points are referred to as synapses, and are realized as a layer of memristive film (or other memristive structure corresponding to the nature of the signal) lying in series between a dendrite of the receiving neuron and a dendrite of the neighboring neuron sending the spike. If the signal is electrical in nature, the dendrites will be realized as metal wires, and the memristor synapse will consist of a thin film containing mobile ionic species, such as a transition metal oxide with a population of oxygen vacancies. In the following discussion, all neuron spiking and synapse mechanisms will be assumed to be electrical in nature.

The synapses change their electrical conductivity in response to the incoming spikes, depending on the amplitude, frequency, and timing with respect to other spikes arriving at the synapse. This change may be volatile or non-volatile, to varying degrees, depending on the duration of the change effected by the spikes. In addition to the memristance, the synapses possess a finite capacitance.

The synapses also modulate the amplitude of the spiking signals traversing them, flowing a current in response to the voltage spike according to the instantaneous resistance of the memristor. These currents pass through the memristive synapse and are aggregated into the neuron according to Kirchhoff's Current Law.

The neuron cell contains one or more metallic or semiconducting bodies—plates, wires, and particles—that are connected to one another by memristor junctions.

In the simplest case, the neuron will consist of a single metallic or semiconducting body, or a common electrode, connected to other neurons by memristors, and one other metallic body, the output electrode, connected to the first by a Mott memristor in parallel with a capacitor, which is an insulating thin film between the two bodies. Other components may be added, linking to the common electrode with capacitors (insulating films), resistors (wires), and inductors, as well as memristors.

The currents aggregating into the neuron through the multiple input memristive synapses charge the capacitor between the common electrode and the output electrode.

When the electric field on the Mott memristor exerted by the accumulated charge on the capacitor exceeds the threshold for its Mott transition to occur, the memristor switches to the low-resistance state, instantaneously discharging the capacitor and generating a spiking event that propagates along the output electrode and its dendrite branches, towards neighboring neurons.

The neuron may contain multiple branches, consisting of a Mott memristor in parallel with a capacitor, each connected—or gated—to the common electrode via a non-volatile switching memristor.

The capacitor, Mott memristor, and switching memristor at each branch may each possess different parameter values (for example capacitance, resistance, and memristor switching thresholds) from those in other branches.

The switching of a non-volatile memristor gating a particular branch to a low-resistance state opens the branch to charging via the common, and discharging via the output electrode.

It is then able to participate in spike generation.

All branches with memristor gates set to the low resistance-state participate in the spiking, interacting mutually with other gates, according to their specific capacitance, resistance, and other parameter values which contribute to their spiking waveform.

A non-volatile memristor gate may be switched to any of a continuum of analog resistance states, modulating the resistance of the branch and its contribution to the spiking.

By selectively opening and closing different branches in the neuron by switching the gate memristors, the neuron realizes a rich variety of spiking behaviors.

The internal switching of the gate memristors that effects the opening and closing of the branches is brought about by spike inputs received from other neurons through the synapse memristors.

The variety within the neuron of responses to the input spikes corresponds to the variety of the spiking patterns the neuron can generate.

The spikes generated by the neuron in turn propagate to other neurons through electrical channels (axon and dendrites), and affect memristor switching that controls the spiking generated in those neurons.

In contrast, the previous method of artificial neural networks (ANNs) is a simulation of neuron weights within a digital computational framework, while spiking neural networks realized on silicon chips to date are also primarily digital entities with synapse weights encoded in memory devices such as SRAM, in which the spiking behavior generated as a response to input spikes is algorithmically encoded in the digital circuitry.

Until this invention disclosed herein, there was no fully physical method of realizing spiking neural networks without using digital circuitry as a computational intermediary for signal processing and generation.

The Mott Neuristor is a device that can generate output spikes in response to input spikes, based on the capacitor discharge triggered by the Mott transition of a volatile memristor. However, there was not yet, until this disclosure, a mechanism by which the spiking mode of a Mott neuristor may be dynamically modulated by purely electrical input signals.

In the prior art, to alter the spiking mode, the capacitor must be manually removed and replaced with a different one.

Example 5

In contrast, the present invention provides a mechanism by which a capacitor-Mott memristor pair may be selected by the switching of a non-volatile memristor, opening or closing conductive paths to allow the involvement of a capacitor-Mott memristor pair in the spiking dynamics of the device.

Example 6

Disclosed herein is a device comprising at least one each of non-volatile memristor, one volatile memristor, and one capacitor, as configured by the following: the non-volatile memristors having a certain sufficiently large resistance ratio between the high-resistance and low-resistance states—for example exceeding 4 decades of magnitude, and retaining its low-resistance and high-resistance states substantially—for example, within a decade of the set value—for a time period exceeding 1 second, the volatile memristors retaining the low-resistance state for a significantly shorter time period, for example, not exceeding 10 nsecs, at least one volatile memristor in parallel with the capacitor, the device comprising a conductor formed into multiple branches, some of which are connected to other conductors in series via non-volatile memristor devices, and some of which are connected to another conductor via two branches, one comprising a volatile memristor and the other comprising a capacitor.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What I claim is:

1. A memristive multi-terminal spiking neuron apparatus, comprising:
   a non-volatile memristor;
     wherein the non-volatile memristor has a resistance ratio between the high-resistance and low-resistance states exceeding 4 decades of magnitude;
     wherein the non-volatile memristor retains its low-resistance and high-resistance states within a decade of the set value for a time period exceeding 1 second;
   a volatile memristor;
     wherein the volatile memristor retains its low-resistance state for a time period of less than 10 nanoseconds; and
   a capacitor;
     wherein the volatile memristor is in parallel with the capacitor,
   a first conductor wherein the first conductor comprises multiple branches and wherein some of the multiple branches overlap with a second, third, and subsequent conductors in series respectively, via non-volatile and volatile memristor film stacks comprising a non-volatile, memristor, a volatile memristor, and a capacitor; and
     wherein some of the multiple branches overlap with a fourth conductor with an interposing dielectric film or films comprising a capacitor, a non-volatile memristor, and a volatile memristor in separate areas or branches of the overlapping area.

2. A method of making a programmable electrical spiking output from a memristive multi-terminal spiking neuron, comprising:
providing one or more neuron devices wherein each neuron device comprises a non-volatile memristor;
wherein the non-volatile memristor has a resistance ratio between the high-resistance and low-resistance states exceeding 4 decades of magnitude;
wherein the non-volatile memristor retains its low-resistance and high-resistance states within a decade of the set value for a time period exceeding 1 second;
a volatile memristor;
wherein the volatile memristor retains its low-resistance state for a time period of less than 10 nanoseconds; and
a capacitor;
wherein the volatile memristor is in parallel with the capacitor;
a first conductor wherein the first conductor comprises multiple branches and wherein some of the multiple branches overlap with a second, third, and subsequent conductors in series respectively, via non-volatile and volatile memristor film stacks comprising a non-volatile, memristor, a volatile memristor, and a capacitor; and
wherein some of the multiple branches overlap with a fourth conductor with an interposing dielectric film or films comprising a capacitor, a non-volatile memristor, and a volatile memristor in separate areas or branches of the overlapping area providing a first input spiking signal to the first one of the neuron devices from a second neuron device;
providing a second input spiking signal from a third one of the devices to the first neuron device;
providing a third input spiking signal from a fourth one of the devices to the first neuron device;
providing a (n-1)th input spiking signal from an n-th one of the devices to the first neuron device; and
creating a programmable spiking output signal from the first neuron device;
wherein the programmable spiking output signal from the neuron device changes in response to the first, second, and third and n-th input spiking signals received.

3. The method of making a programmable electrical spiking output from a memristive multi-terminal spiking neuron of claim 2, further comprising wherein the input spiking signal from one of the other neuron devices to the first neuron device is an electrical input spiking signal.

4. The method of making a programmable electrical spiking output from a memristive multi-terminal spiking neuron of claim 3, further comprising wherein the programmable spiking output signal from the neuron device is an electrical spiking output signal.

* * * * *